United States Patent [19]

Dermarkar et al.

[11] Patent Number: 5,347,426
[45] Date of Patent: Sep. 13, 1994

[54] ELECTRONIC DEVICE INCLUDING A PASSIVE ELECTRONIC COMPONENT

[75] Inventors: Salim Dermarkar, Saint Jean de Moirans, France; Xavier Dumant, Montreal, Canada; Michel Lebailly, Bollene, France

[73] Assignee: Pechiney Recherche, Paris, France

[21] Appl. No.: 118,176

[22] Filed: Sep. 9, 1993

Related U.S. Application Data

[63] Continuation of Ser. No. 927,730, Aug. 11, 1992, abandoned, which is a continuation of Ser. No. 682,958, Apr. 10, 1991, abandoned, which is a continuation-in-part of Ser. No. 362,366, Jun. 5, 1989, abandoned.

[30] Foreign Application Priority Data

Sep. 13, 1988 [FR] France ............................ 88 12548

[51] Int. Cl.$^5$ ............................................ H05K 7/20
[52] U.S. Cl. .................................. 361/708; 165/185; 174/16.3; 257/703; 361/722; 428/614
[58] Field of Search ............. 428/614, 901; 165/80.3, 165/185; 174/16.3, 52.2, 252; 257/703, 705, 713; 361/688, 704–708, 709, 713, 718, 722, 760; 419/17, 27

[56] References Cited

U.S. PATENT DOCUMENTS

| | | | |
|---|---|---|---|
| 4,871,008 | 10/1989 | Dwivedi | 164/6 |
| 4,961,767 | 10/1990 | Schermerhorn | 65/2 |
| 5,020,583 | 6/1991 | Aghajanian | 164/97 |
| 5,063,121 | 11/1991 | Sato | 428/698 |
| 5,224,017 | 6/1993 | Martin | 361/388 |
| 5,246,736 | 9/1993 | Goujard | 427/249 |
| 5,250,848 | 10/1993 | Christie | 257/778 |

*Primary Examiner*—Gerald P. Tolin
*Attorney, Agent, or Firm*—Dennison, Meserole, Pollack & Scheiner

[57] ABSTRACT

An electronic device comprising at least one heat-generating electronic component and a passive electronic component in association with the heat generating component. The passive component comprises a porous preform of green silicon carbide or polygranular graphite, and a metal filling the porosities of the preform which can be aluminum, an aluminum alloy, magnesium or a magnesium alloy. The preform forms about 50 to 90% by volume of the passive component.

8 Claims, 2 Drawing Sheets

ELECTRONIC DEVICE INCLUDING A PASSIVE ELECTRONIC COMPONENT

This application is a continuation of Ser. No. 927,730, Aug. 11, 1992, abandoned, which is a continuation of Ser. No. 682,958, Apr. 10, 1991, abandoned, which is a continuation-in-part of U.S. application Ser. No. 07/362,366, Jun. 5, 1989, now abandoned.

BACKGROUND OF THE INVENTION

The invention concerns a material for passive electronic components with high thermal conductivity, low density and low coefficient of thermal expansion.

The term "passive electronic components" here refers to those not directly involved in electronic activity. The invention relates more particularly to materials for making structures such as sinks, supports and pole pieces in power circuits, laser diode supports, heat sinks and encapsulating cases in hybrid microelectronic power circuits and ultra high frequency circuits. The term electronic also includes the optoelectronic field.

In the components in question these materials are known to be joined generally to insulating ceramic substances such as alumina or semiconductors such as silicon or gallium arsenide.

If the components include power elements, a large amount of heat is emitted when they operate. This has to be dissipated as rapidly as possible, to avoid damaging the components by excessive heating. A material of the highest possible thermal conductivity is therefore used.

The temperature nevertheless rises, and if the coefficient of thermal expansion of the material differs too much from that of the ceramic insulator or semi conductor substrate, the stresses which are set up in the substrate are greater than the resistance of the ceramic. The ceramic therefore breaks, impairing the efficiency of the whole unit. Thus it is also necessary for the material to have a coefficient which is compatible with that of alumina or silicon and preferably below $16 \times 10^{-6} \cdot K^{-1}$ in the 30°–400° C. temperature range.

The fact that these circuits may be used in vehicles driven by a source of energy has led to a search for materials with the lowest possible density, preferably below 3100 kg.m.$^{-3}$, in order to minimise the energy consumption required to propel the vehicles.

Since the circuits are affected by their surroundings, the material should also have a suitable amagnetic character and good resistance to the external environment.

A large amount of research has been carried out to find a material which would form a compromise between all these properties, and there have been more or less interesting findings.

Thus materials such as steel, beryllium and some aluminium alloys have been tried because of their good conductivity; but their relatively high modulus of elasticity and expansion capacity make it necessary to use joints or adhesives to accommodate the difference from the expansion capacity of the alumina, and this reduces the thermal conductivity of the whole unit.

Researchers then turned to materials with low expansion capacity, such as kovar (iron-nickel-cobalt alloy) or molybdenum or multi metal materials of the copper/invar/copper type as well as titanium and its alloys. But apart from molybdenum all these materials are handicapped by low conductivity, particularly in the direction perpendicular to the plane of the substrate. They all have high density also; the lowest density, that of titanium, is of the order of 4500 kg.m.$^{-3}$. In addition molybdenum is expensive and difficult to use because of its poor resistance to oxidation; as for kovar, it is tricky to machine as it is twisted by internal stresses, and many annealing operations are necessary if it is to be worked correctly.

SUMMARY OF THE INVENTION

Hence applicants realised that there were deficiencies materials so far used. They therefore sought to develop a new material which would provide a compromise between the following properties:
coefficient of thermal expansion: must be low and compatible with that of a ceramic such as alumina, silicon or gallium arsenide for a temperature variation of up to 400° C.;
thermal conductivity: as high as possible
density: as low as possible
imperviousness to the surroundings
good resistance to corrosion
appropriate machinability
suitability for nickel, silver or gold plating
suitability for welding
non-magnetic character Their research has led to an isotropic material for passive electronic components, i.e. one which has a mean coefficient of expansion between 30° C. and 250° C. of from $2 \times 10^{-6} \cdot K^{-1}$ to $13 \times 10^{-6} \cdot K^{-1}$ in all directions, a density of less than 3100 kg.m$^{-3}$ and a thermal conductivity of over $100$ W.m$^{-1} \cdot K^{-1}$. The structure is composite and the material is formed firstly by a metal from the group comprising aluminium and alloys thereof and magnesium and alloys thereof, and secondly by a ceramic from the group comprising particles of green silicon carbide and polygranular graphite, the ceramic being used in proportions of from 50 to 90% by volume.

DETAILED DESCRIPTION OF THE INVENTION

In order to have very high conductivity, i.e. above $150^{W.m^{-1} \cdot K^{-1}}$ a coefficient of expansion from 7 to $13 \times 10^{-6} \cdot K^{-1}$ and a Young's modulus higher than 120 GPa, it is preferable to use particles of green silicon carbide in proportions of from 50 to 75%.

If a lower coefficient of expansion, from $4 \times 10^{-6}$ to $10 \times 10^{-6} \cdot K^{-1}$, a lower density, below 2300 kg.m$^{-3}$ and a Young's modulus below 50 GPa are required, though still with thermal conductivity higher than 100 W.m$^{-1} \cdot K^{-1}$, polygranular graphite should be used in proportions of from 65 to 90% by volume.

Thus the material of the invention differs from the previous ones, in that it does not just consist of one or more metals in a sandwich arrangement, but rather of poly phased mixtures of metal and ceramic with an isotropic structure.

The metal may be pure aluminium, pure magnesium or alloys thereof. These metals in fact combine good conductivity, low density and low melting point.

The alloys are chosen for their conductivity, in the realisation that it decreases according to the nature and quantity of the elements of addition, and that it decreases more when these elements are in solid solution than when they are in precipitate form.

In the case of aluminum alloys, those with few elements of addition are used. Zinc, copper, magnesium, iron and nickel can be tolerated in small quantities, whereas manganese, titanium, vanadium and lithium must be avoided.

It is preferable to use alloys in Aluminum Association series 1000, 5000 and 6000 and casting-alloys. Among the casting alloys those containing 7, 10 and 13% of silicon are more particularly preferred, such as alloys A 356, A 357 and A 413.2, and in series 6000 alloys 6061 and 6101, as defined by Aluminum Association standards.

The material according to the invention also comprises ceramic elements in the form of equiaxed particles or porous polygranular bodies.

Not all ceramic elements are equally effective, and it is preferable to use those which have a low coefficient of thermal expansion, high thermal conductivity and low density.

More specifically, silicon carbide or polygranular graphite are used; these have properties which give an excellent compromise.

As far as the silicon carbide (SiC) particles are concerned, these are from 0.5 to 400 microns and more specifically from 3 to 50 microns in size.

If the composite obtained is to have high thermal conductivity, the particles of SiC must necessarily be very pure and contain over 90% by weight of SiC. This grade of SiC is usually described as "green SiC". According to the "GMELIN Handbook of Inorganic Chemistry" 8th edition, Supplement Vol. B3, p. 60, ed. Springer Verlag 1986, its composition is as follows:

|                                | % by weight     |
|--------------------------------|-----------------|
| SiC                            | 99.00 to 99.4   |
| Free C                         | 0.05 to 0.10    |
| $SiO_2$                        | 0.40 to 0.60    |
| $Fe_2O_3$                      | 0.10 to 0.20    |
| $Al_2O_3$                      | 0.05 to 0.10    | as compared with the "black SiC" normally used in prior art, which is of the following composition:

|                                | % by weight     |
|--------------------------------|-----------------|
| SiC                            | 98.75 to 99.2   |
| Free C                         | 0.10 to 0.15    |
| $SiO_2$                        | 0.50 to 0.70    |
| $Fe_2O_3$                      | 0.10 to 0.20    |
| $Al_2O_3$                      | 0.25 to 0.35    |

As far as graphite is concerned, porous polygranular masses having individual grains smaller than 20 microns in size are used. The graphite grain has an equiaxed shape, and the graphite mass does not have any favored direction, so as to retain the isotropic character of the product. This particularly excludes any graphite fibres. The ceramic may be used in various forms known as porous preforms:
either in the form of agglomerated particles, especially in the case of silicon carbide
or in the form of polygranularmasses, in the case of graphite.

In the invention Applicants have used porous preforms in which the fraction of ceramic phase is over 50% and under 90% by volume. A fraction of less than 50% by volume would in fact give the composite too high a coefficient of expansion, over $13 \times 10^{-6}.K^{-1}$, while a fraction of over 90% by volume would create technical problems in production.

The preform is then penetrated by the liquid metal by processes known in the art (see e.g. A. G. KELLY and G. I. DAVIES, Metallurgical Reviews, 1965, Vol. 10 No. 37), which may involve using applied pressure and/or preheating; but any other known impregnating or moulding method may be used (see patents U.S. Pat. No. 4,376,804, EP 0105890 and EP 045510 for example). A composite is formed with interpenetrated networks of a ceramic phase and a metallic phase. In the case of metal made of a series 6000 alloy, alloy AA 356 or AA 357 or any alloy which may give rise to structural hardening, the material, once moulded, is subjected to heat treatment of the annealing or tempering type to improve its mechanical properties.

The composite material thus obtained may require additional machining and surface treatment operations (nickel, silver or gold plating), which are well known in the art.

The material can then give its associated active and/or passive components bonding functions (in the case of a support), bonding and heat dissipating functions (in the case of a heat sink), bonding, heat dissipating and interconnecting functions (in the case of an encapsulating case), or bonding, heat dissipating, interconnecting functions or functions of protecting it from its surroundings (in the case of a hermetically sealed encapsulating case).

In special cases where a hermetically sealed case is required, a case is first formed, the semiconductor elements or insulators and active circuits are placed inside it, and the case is closed with a cover which is fixed on by laser braze welding.

And finally, structures of the heat sink or support type may, if appropriate, be protected by a varnish or resin.

BRIEF DESCRIPTION OF THE DRAWING

The invention will be understood better from the accompanying figures, in which.

DESCRIPTION OF THE PREFERRED EMBODIMENTS

Figure 1:
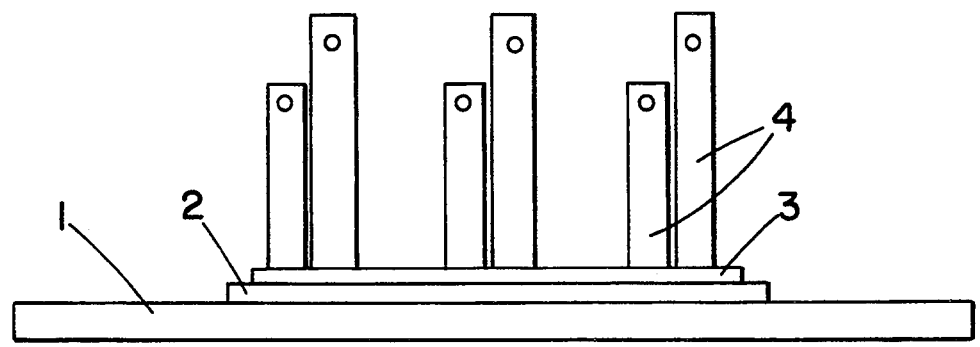
FIG. 1 is a view in vertical section through an electronic component comprising a structure in the form of a heat sink for a power circuit.

In FIG. 1, a heat sink 1 is made of material according to the invention, with an insulator 2 formed by a layer of alumina resting on it; an active circuit 3 is placed on the alumina and connected to its surroundings by input-/output connections 4.

Figure 2:
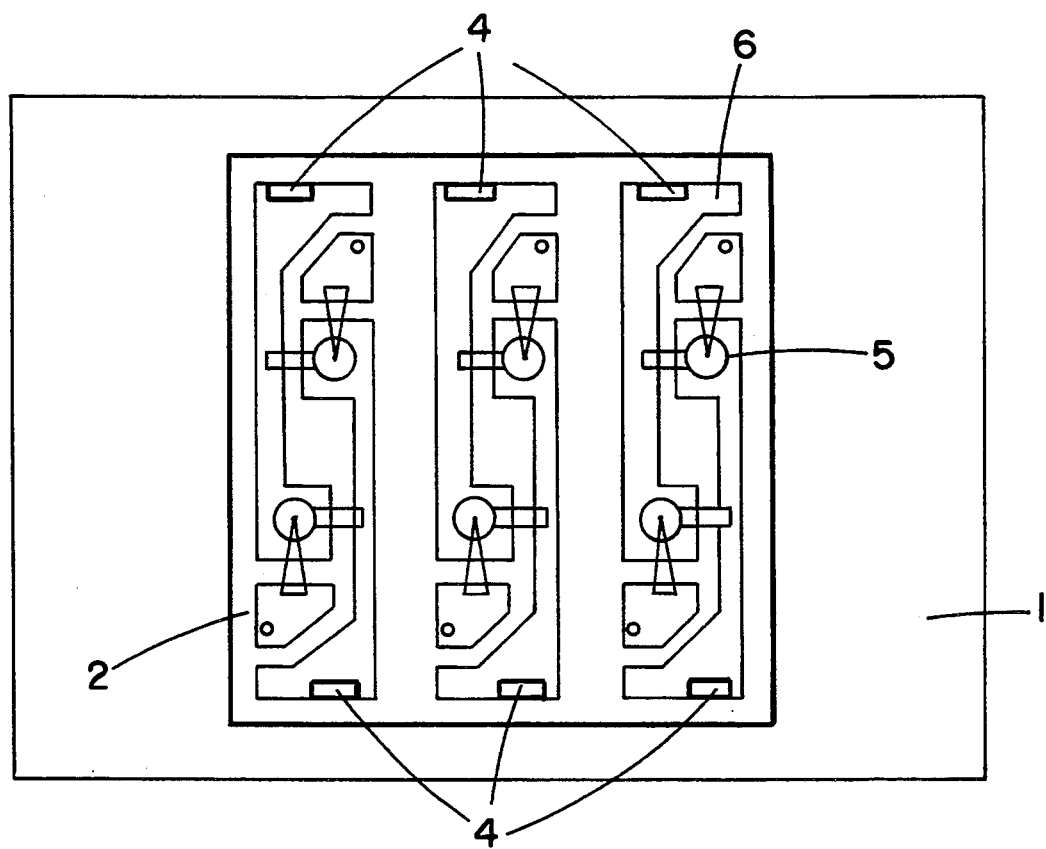
FIG. 2 is a plan view of the FIG. 1 component.

In FIG. 2, the sink 1, its insulator 2, its active circuit 3 formed by thyristors 5, conductive tracks 6 and their connections 4, are shown.

Figure 3:
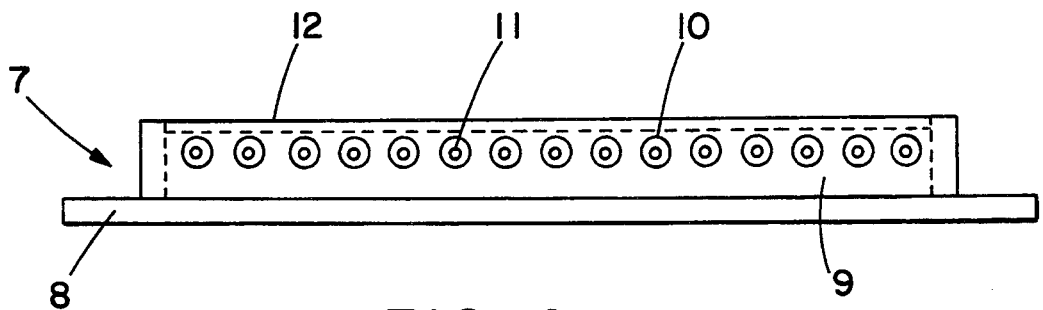
FIG. 3 is a view in vertical section through an electronic component comprising a structure in the form of an encapsulating case with its connections and cover.

In FIG. 3, a case 7 is made of material according to the invention, formed by a base 8 with a frame 9 resting on it. The frame contains holes 10 through which the connections 11 of the active circuits pass. A cover 12 is fixed inside the top of the frame.

Figure 4:
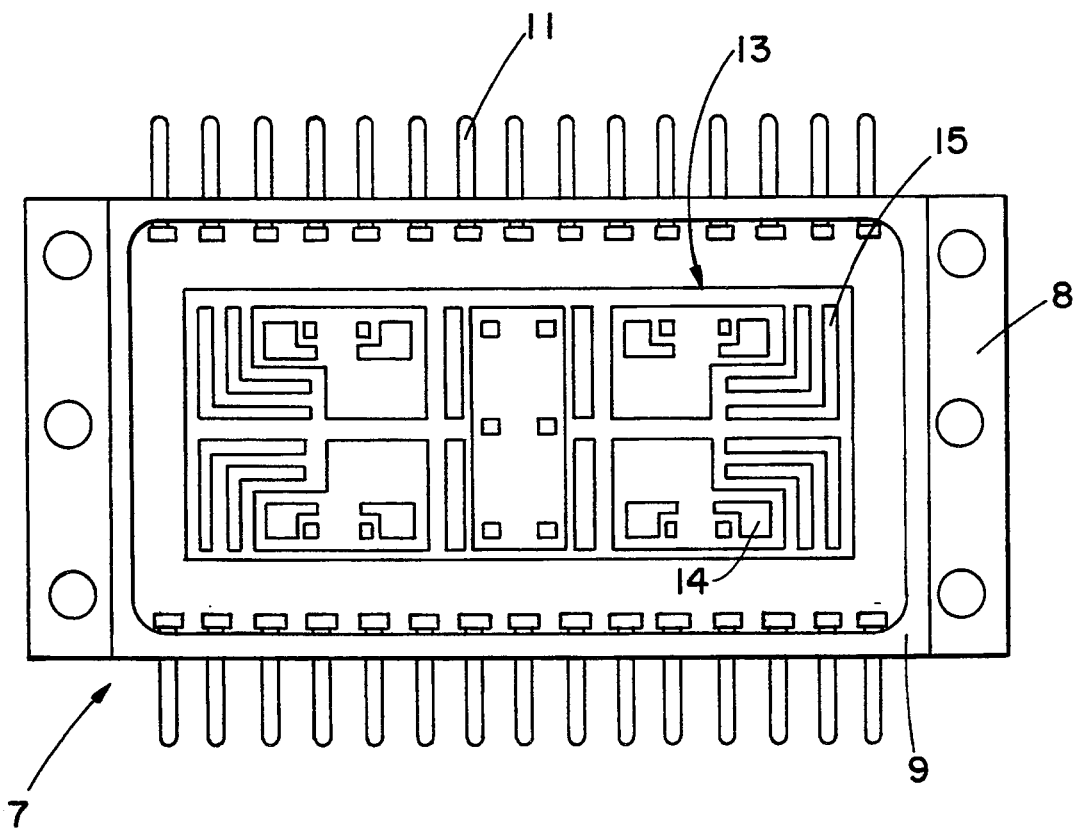
FIG. 4 is a plan view of the FIG. 3 component, with the cover removed.

In FIG. 4, a case 7 has base 8, frame 9 and connections 11. An insulator 13 rests on the base and active circuits 14 comprising conductive tracks 15 are placed on it. The bonds between the connections and the active circuits have not been shown.

To ensure the dimensional stability and integrity of the interconnections in such assemblies when they are subjected to the thermal cycle, it is essential for the composite material to have the same thermal expansion coefficient in all directions. Only isotropic composite materials have therefore been used in the invention. The invention is illustrated by the following examples.

EXAMPLE 1

Composite materials are produced, formed by a metal selected from alloys AA1050 and A357 and a ceramic in the form of black SiC particles of less than 99% purity and with numerous lattice impurities, or green SiC of over 99% purity with few lattice impurities, by the following method. A preform 120 mm in diameter is obtained by filtering a suspension of SiC particles with an average size of 44.5 microns, containing colloidal silica to give it cohesion. When dried it contains 55% of particles and 5.5% of silica by volume. The preform is penetrated by the lost wax foundry moulding method. After solidification and demoulding, the composite material obtained has a density of 2975 kg.m$^{-3}$ corresponding to the theoretical value. The mean coefficient of expansion is $10.5 \times 10^{-6}$·K$^{-1}$ between 30° and 250° C. It is the same in all directions. The Young's modulus is 125 GPa and the bending strength 307 MPa. The electrical resistivity is 11 microhm-cm. The thermal conductivity of the composite material is calculated through measuring the thermal diffusivity and volumetric heat by the flash method. The experimental values (in W. m$^{-1}$·K$^{-1}$) are given in the following table with the type of particles and the nature of the alloy.

| | Thermal conductivity (W.M$^{-1}$·K$^{-1}$) | |
|---|---|---|
| | Black SiC | Green SiC |
| Alloy AA1070 | 122 | 170 |
| Alloy A357 | 113 | 171 |

The purity of the SiC particles is found to have far more effect on the thermal conductivity of the composite material than the choice of alloy. Hence it is necessary to select SiC particles with a controlled content of lattice impurities, and with an SiC content of over 99% by weight (green SiC) in order to have conductivity above 150 W·m$^{-1}$·K$^{-1}$.

EXAMPLE 2

A composite material is produced, containing alloy AA1090 and 18% by volume of ex. P.A.N. carbon fibres (polyacrylonitrile) graphited at 2600° C., with a density of about 2500 kg·m$^{-3}$, a conductivity in the direction perpendicular to the plane of the fibres of 164 W·m$^{-1}$·K$^{-1}$, tangent coefficient of expansion at 30° C. of the order of $19 \times 10^{-6}$·K$^{-1}$, from 30° to 250° C., on the order of $6.4 \times 10^{-6}$·K$^{-1}$, and from 30° to 400° C. on the order of $3 \times 10^{-6}$·K$^{-1}$, for measurements taken in the plane. On the otherhand, the coefficient of expansion from 30° to 250° C. is $55.5 \times 10^{-6}$·K$^{-1}$ when measured in the direction normal to the plane.

This example shows that it is not advisable to use the ceramic phase in fibre form, since this makes the expansion properties very anisotropic.

In this case there is almost a factor of 10 between the coefficient of expansion in the plane and the coefficient of expansion normal to the plane.

EXAMPLE 3

Materials are made comprising a polygranular graphite (Carbone Lorraine reference S2457) and various aluminium and magnesium alloys. The alloys are aluminium of over 99.7% purity (AA1070), aluminium containing 5% of magnesium (AG5), aluminium containing 5% of nickel (AN5), aluminium containing 7% of silicon and 0.6% of magnesium (A 357) and magnesium containing 5% of zinc and about 1% of rare earths (RZ5).

When the composite materials have solidified and been demoulded, their properties of expansion, thermal conductivity, density and in some cases also elasticity, rigidity and electric resistivity are determined. All the properties obtained are isotropic.

The results are given in the table.

| Matrix | Coefficient of thermal expansion from 30 to 250° C. 10$^{-6}$·K$^{-1}$ | Thermal conductivity W.m.$^{-1}$·K$^{-1}$ | Density kg.m$^{-3}$ | Young's modulus GPa | Bending strength MPa | Electrical resistivity Microhm-cm |
|---|---|---|---|---|---|---|
| AA1070 | 6.0 | 133 | 2200 | 20 | 58 | 125 |
| A357 | 7.4 | 142 | 2200 | 23 | 128 | 150 |
| AG5 | 7.9 | 124 | 2200 | — | — | — |
| AN5 | 5.3 | 124 | 2200 | — | — | — |
| RZ5 | 6.5 | 128 | 1700 | — | — | — |

The various compositions of aluminium and magnesium based alloys give different compromises between properties. It will be noted in particular that coefficients of expansion very close to those of alumina or gallium arsenide can be obtained while still keeping very high thermal conductivity.

EXAMPLE 4

Composite materials are made comprising various types of polygranular graphite with different densities (Carbone Lorraine references S2512 - S2457 - S2545) and an aluminium of over 99.7% purity. The proportion of graphite in the composites is from 50 to 90 volume percent.

Composites are obtained after impregnation and demoulding, and their properties of expansion, thermal conductivity, density and in some cases elasticity, rigidity and electric resistivity are determined. All the properties obtained are isotropic.

| Volumic fraction of graphite % | Graphite reference | Coefficient of thermal expansion from 30 to 250° C. 10$^{-6}$·K$^{-1}$ | Thermal conductivity W.m.$^{-1}$·K$^{-1}$ | Density kg/m$^{-3}$ | Young' modulus GPa | Bending strength MPa | Electrical resistivity Microhm-cm |
|---|---|---|---|---|---|---|---|
| 82 | S2512 | 2.9 | 113 | 2200 | 18 | 72 | — |
| 69 | S2457 | 6.0 | 133 | 2200 | 20 | 58 | 125 |

-continued

| Volumic fraction of graphite % | Graphite reference | Coefficient of thermal expansion from 30 to 250° C. $10^{-6} \cdot K^{-1}$ | Thermal conductivity $W.m^{-1} \cdot K^{-1}$ | Density $kg/m^{-3}$ | Young' modulus GPa | Bending strength MPa | Electrical resistivity Microhm-cm |
|---|---|---|---|---|---|---|---|
| 60 | S2545 | 10.0 | 129 | 2300 | 25 | 32 | 25 |

The different grades of graphite give different compromises between properties. It will be observed in particular that graphite grade S2512 gives a coefficient of expansion equivalent to that e.g. of silicon or aluminum nitride.

All the composite materials and composite structures obtained from the materials described in Examples 1 to 4 have a mean coefficient of thermal expansion, from 30° to 250° C., of under $13 \times 10^{-6} \cdot K^{-1}$ and over $2 \times 10^{-6} \cdot K^{-1}$ and thermal conductivity over 100 $W.m^{-1} \cdot K^{-1}$ in all directions.

These properties are given in Table I.

TABLE I
ISOTROPIC MATERIALS AND STRUCTURES

| Composite | Coefficient of thermal expansion from 30 to 250° C. $10^{-6} \cdot K^{-1}$ | Thermal conductivity $W.m^{-1} \cdot K^{-1}$ |
|---|---|---|
| Green SiC particles AA 1070 | 10.5 | 170 |
| S2545 polygranular graphite/AA1070 | 10.0 | 129 |
| S2457 polygranular graphite/AG5 | 7.9 | 124 |
| S2457 polygranular graphite/A357 | 7.4 | 142 |
| S2457 polygranular graphite RZ5 | 6.5 | 128 |
| S2457 polygranular graphite/AA1070 | 6 | 133 |
| S2457 polygranular graphite/AN5 | 5.3 | 124 |
| S2512 polygranular graphite/AA1070 | 2.9 | 113 |

What is claimed is:

1. An electronic device comprising:
   a) at least one heat-generating electronic component; and
   b) a passive electronic component supporting said at least one heat-generating electronic component, said passive electronic component comprising:
   a porous preform comprising particles of green silicon carbide or polygranular graphite, and
   a metal filling the porosities of said preform by penetration of metal in liquid form followed by solidification, said metal selected from the group consisting of aluminum, an aluminum alloy, magnesium and a magnesium alloy,
   said preform forming about 50 to 90% by volume of said passive electronic component,
   said passive electronic component being formed of an isotropic composite made of two randomly oriented interpenetrating networks of a ceramic phase and a metallic phase, and having a coefficient of thermal expansion below about $1.3 \times 10^{-6} K^{-1}$ at 30°–400° C. and a density below about 3100 $kg.m^{-3}$.

2. The device of claim 1, wherein said passive electronic component has a coefficient of thermal expansion from $7 \times 10^{-6}$ to $13 \times 10^{-6}.K^{-1}$, thermal conductivity higher than 150 $W.m^{-1}.K^{-1}$ and a Young's modulus higher than 120 GPa, and wherein particles of green silicon carbide comprise from 50 to 75% by volume of said passive electronic component.

3. The device of claim 1, wherein said passive electronic component has a coefficient of expansion from $4 \times 10^{-6}$ to $10 \times 10^{-6}.K^{-1}$, density below 2300 $kg.m^{-3}$, thermal conductivity higher than 100 $W.m^{-1}.K^{-1}$ and a Young's modulus below 50 GPa, and wherein polygranular graphite comprises from 60 to 90% by volume of said passive electronic component.

4. The device of claim 1, wherein the metal is selected from the group consisting of aluminum alloys A356 and A357.

5. The device of claim 1, wherein said passive electronic component is selected from the group consisting of heat sinks, supports, pole pieces, laser diode supports, and encapsulating cases.

6. The device of claim 1, wherein said at least one heat-generating electronic component is an electronic circuit comprising a plurality of components.

7. The device of claim 6, wherein the circuit is in contact with an insulator, and the insulator is in contact with said passive electronic component.

8. An electronic device comprising:
   a) at least one heat-generating electronic component; and
   b) a passive electronic component supporting said at least one heat-generating electronic component, said passive electronic component comprising:
   a porous preform comprising particles of green silicon carbide or polygranular graphite, and
   a metal filling the porosities of said preform by penetration of metal in liquid form followed by solidification, said metal selected from the group consisting of aluminum, an aluminum alloy, magnesium and a magnesium alloy,
   said preform forming about 50 to 90% by volume of said passive electronic component,
   said passive electronic component being formed of an isotropic composite made of two randomly oriented interpenetrating networks of a ceramic phase and a metallic phase.

* * * * *

UNITED STATES PATENT AND TRADEMARK OFFICE
CERTIFICATE OF CORRECTION

PATENT NO.   : 5,347,426  
DATED        : September 13, 1994  
INVENTOR(S)  : Dermarkar et al.

It is certified that error appears in the above-identified patent and that said Letters Patent is hereby corrected as shown below:

Column 8,
Line 10, change "1.3" to -- 13 --.

Signed and Sealed this

Twenty-ninth Day of October, 2002

*Attest:*

JAMES E. ROGAN
*Attesting Officer*         *Director of the United States Patent and Trademark Office*

(12) EX PARTE REEXAMINATION CERTIFICATE (5528th)
United States Patent
Dermarkar et al.

(10) Number: US 5,347,426 C1
(45) Certificate Issued: Sep. 26, 2006

(54) ELECTRONIC DEVICE INCLUDING A PASSIVE ELECTRONIC COMPONENT

(75) Inventors: Salim Dermarkar, Saint Jean de Moirans (FR); Xavier Dumant, Montreal (CA); Michel Lebailly, Bollene (FR)

(73) Assignee: Electrovac GesmbH, Klosterneuburg (AT)

Reexamination Request:
No. 90/006,897, Dec. 29, 2003

Reexamination Certificate for:
Patent No.: 5,347,426
Issued: Sep. 13, 1994
Appl. No.: 08/118,176
Filed: Sep. 9, 1993

Certificate of Correction issued Oct. 29, 2002.

Related U.S. Application Data

(63) Continuation of application No. 07/927,730, filed on Aug. 11, 1992, now abandoned, which is a continuation of application No. 07/682,958, filed on Apr. 10, 1991, now abandoned, which is a continuation-in-part of application No. 07/362,366, filed on Jun. 5, 1989, now abandoned.

(51) Int. Cl.
*H05K 7/20* (2006.01)
*C04B 35/65* (2006.01)

(52) U.S. Cl. .................. 361/708; 361/722; 165/185; 174/16.3; 428/614; 257/703

(58) Field of Classification Search .................. None
See application file for complete search history.

(56) References Cited

PUBLICATIONS

Definition of "pitch–based carbon fibres," IUPAC Compendium of Chemical Terminology, 2nd Edition (1997).
Definition of "carbon fibre," IUPAC Compendium of Chemical Terminology, 2nd Edition (1997).
Definition of "inclusion," Webster's Revised Unabridge Dictionary, ©1996, 1998 MICRA, Inc.
*Metals Handbook*, Copyright 1985, Glossary of Metallurgical Terms and Engineering Tables, p. 1·22, published by American Society for Metals, U.S.A.

*Primary Examiner*—Michael Datskovskiy

(57) ABSTRACT

An electronic device comprising at least one heat-generating electronic component and a passive electronic component in association with the heat generating component. The passive component comprises a porous preform of green silicon carbide or polygranular graphite, and a metal filling the porosities of the preform which can be aluminum, an aluminum alloy, magnesium or a magnesium alloy. The preform forms about 50 to 90% by volume of the passive component.

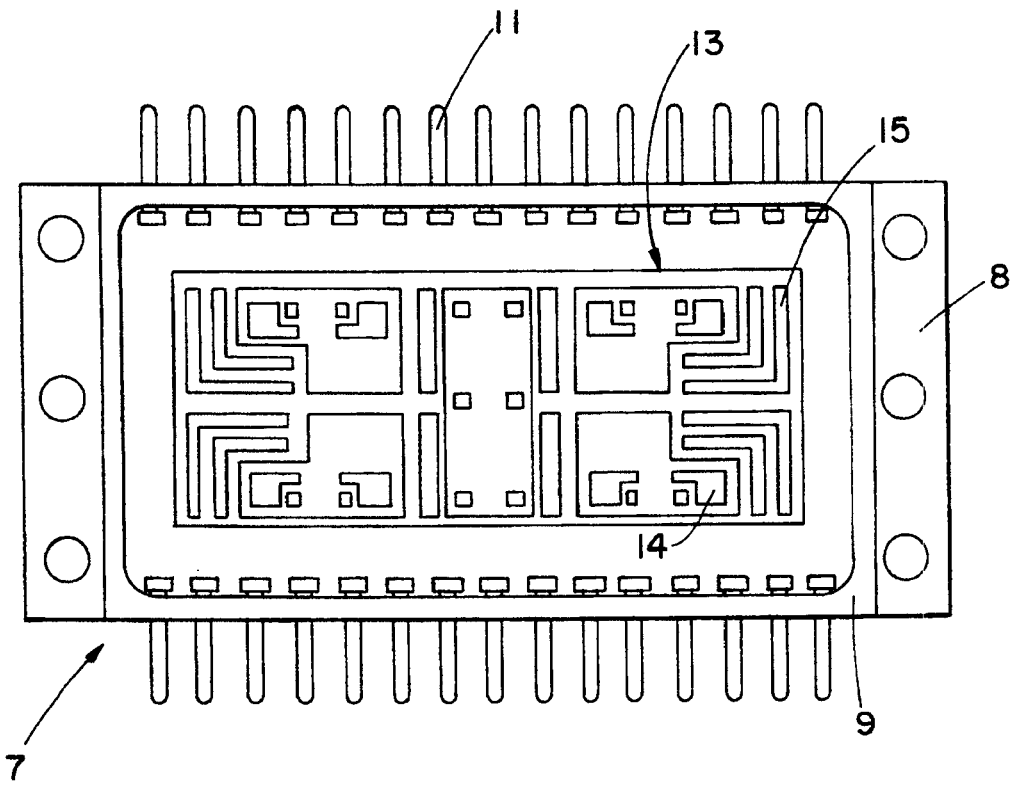

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 9 and 10 are cancelled.

Claims 1, 3–6 and 8 are determined to be patentable as amended.

Claims 2 and 7, dependent on an amended claim are determined to be patentable.

New claims 11–20 are added and determined to be patentable.

1. An electronic device comprising:
a) at least one heat-generating electronic component; and
b) a passive electronic component supporting said at least one heat-generating electronic component, said passive electronic component comprising:
a porous preform comprising particles of green silicon carbide [or polygranular graphite] *having at least 99% by weight of silicon carbide, no greater than 0.1% by weight of free carbon, and no greater than 0.1% by weight of alumina,* and
a metal filling the porosities of said preform by penetration of metal in liquid form followed by solidification, said metal selected from the group consisting of aluminum, an aluminum alloy, magnesium and a magnesium alloy, *and*
said preform forming *a ceramic phase of* about 50 to 90% by volume of said passive electronic component, *and said metal forming a metallic phase of about 10 to 50% by volume of said passive electronic component,*
said passive electronic component being formed of an isotropic composite [made] *consisting essentially* of two randomly oriented interpenetrating networks of [a] *the* ceramic phase and [a] *the* metallic phase, [and having a coefficient of thermal expansion below about 13×10⁻⁶ K⁻¹ at 30–400° C. and a density below] *such that said isotropic composite has an isotropic thermal conductivity greater than 100 W.m⁻¹.K⁻¹, a coefficient of thermal expansion less than 13×10⁻⁶K⁻¹ at temperatures between 30 degrees centigrade and 400 degrees centigrade, and a density less than* 3100 kg.m⁻³.

3. The device of claim [1] *8*, wherein said passive electronic component has a coefficient of expansion from 4×10⁻⁶ to 10×10⁻⁶·K⁻¹, density below 2300 kg·m⁻³, thermal conductivity higher than 100 W.m⁻¹·K⁻¹ and a Young's modulus below 50 GPa, and wherein [polygranular graphite] *said preform* comprises from 60 to 90% by volume of said passive electronic component.

4. The device of claim [1] *8*, wherein the metal is selected from the group consisting of aluminum alloys A356 and A357.

5. The device of claim [1] *8*, wherein said passive electronic component is selected from the group consisting of heat sinks, supports, pole pieces, laser diode supports, and encapsulating cases.

6. The device of claim [1] *8*, wherein said at least one heat-generating electronic component is an electronic circuit comprising a plurality of components.

8. An electronic device comprising:
a) at least one heat-generating electronic component; and
b) a passive electronic component supporting said at least one heat-generating electronic component, said passive electronic component comprising:
a porous preform comprising [particles of green silicon carbide or] polygranular graphite, and
a metal filling the porosities of said preform by penetration of metal in liquid form followed by solidification, said metal selected from the group consisting of aluminum, an aluminum alloy, magnesium and a magnesium alloy,
said preform forming about 50 to 90% by volume of said passive electronic component,
said passive electronic component being formed of an isotropic composite made of two randomly oriented interpenetrating networks of a ceramic phase and a metallic phase.

*11. The device of claim 1, wherein said preform is further comprised of no greater than 0.1% by weight of $Fe_2O_3$.*

*12. The device of claim 1, wherein said silicon carbide particles have a size from 0.5 to 400 microns.*

*13. The device of claim 1, wherein said silicon carbide particles have a size from 3 to 50 microns.*

*14. The device of claim 1, wherein said metal is of an aluminum alloy.*

*15. The device of claim 14, wherein said aluminum alloy comprises aluminum and silicon.*

*16. The device of claim 15, wherein said aluminum alloy does not comprise any of the following metals: manganese, titanium, vanadium, and lithium.*

*17. An electronic device according to claim 8, wherein*
*said preform is comprised of a porous mass of polygranular graphite, and*
*said passive electronic is formed of an isotropic composite consisting essentially of two randomly oriented interpenetrating networks of said preform and said metallic phase, such that said isotropic composite has an isotropic coefficient of thermal expansion less than $13 \times 10^{-6} K^{-1}$ at 30 degrees centigrade to 400 degrees centigrade, and said isotropic composite has a density less than 3100 kg.m⁻³.*

*18. The device of claim 17, wherein said porous mass of polygranular graphite has individual grains of graphite having a grain size less than 20 microns.*

*19. The device of claim 18, wherein said individual grains are substantially of an equiaxed shape, and said porous mass of polygranular graphite contains no graphite fibers.*

*20. The device of claim 17, wherein said metallic phase has a composition of at least 99.7% aluminum by weight of said metal, and said porous mass of polygranular graphite has a polygranular graphite grade selected, such that said isotropic coefficient of thermal expansion is no greater than $6 \times 10^{-6} K^{-1}$, and said isotropic composite has a thermal conductivity greater than 100 W.m⁻¹.K⁻¹.*

* * * * *